United States Patent
Shin

(10) Patent No.: US 9,437,314 B2
(45) Date of Patent: Sep. 6, 2016

(54) PRECHARGE CONTROL SIGNAL GENERATOR AND SEMICONDUCTOR MEMORY DEVICE THEREWITH

(71) Applicant: Samsung Electronics Co., Ltd., Suwon-si (KR)

(72) Inventor: Hyun-Jin Shin, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/737,938

(22) Filed: Jun. 12, 2015

(65) Prior Publication Data

US 2016/0064091 A1    Mar. 3, 2016

(30) Foreign Application Priority Data

Aug. 27, 2014 (KR) .................. 10-2014-0112588

(51) Int. Cl.
| | |
|---|---|
| *G11C 7/12* | (2006.01) |
| *G11C 7/06* | (2006.01) |
| *G11C 11/406* | (2006.01) |
| *G11C 11/4091* | (2006.01) |
| *G11C 16/24* | (2006.01) |
| *G11C 16/28* | (2006.01) |
| *G11C 7/04* | (2006.01) |
| *G11C 16/26* | (2006.01) |
| *G11C 7/08* | (2006.01) |
| *G11C 16/32* | (2006.01) |

(52) U.S. Cl.
CPC ............... *G11C 16/24* (2013.01); *G11C 7/04* (2013.01); *G11C 7/12* (2013.01); *G11C 16/26* (2013.01); *G11C 16/28* (2013.01); *G11C 7/06* (2013.01); *G11C 7/08* (2013.01); *G11C 16/32* (2013.01)

(58) Field of Classification Search
CPC .............. G11C 7/12; G11C 7/08; G11C 7/06
USPC ......................................... 365/203, 211, 222
See application file for complete search history.

(56) References Cited

U.S. PATENT DOCUMENTS

| | | | |
|---|---|---|---|
| 6,999,355 B2 * | 2/2006 | Benzinger ............... | G11C 5/14 365/189.09 |
| 7,403,423 B2 | 7/2008 | Marotta et al. | |
| 8,089,814 B2 | 1/2012 | Park | |
| 8,575,912 B1 | 11/2013 | Tung | |
| 8,598,931 B2 | 12/2013 | Matsui | |
| 2005/0018507 A1 * | 1/2005 | Schroder ............... | G11C 7/04 365/203 |
| 2006/0143371 A1 * | 6/2006 | Rudelic ............... | G06F 13/1668 711/106 |
| 2008/0123451 A1 * | 5/2008 | Rao ........................ | G11C 7/12 365/203 |
| 2009/0262587 A1 * | 10/2009 | Park ...................... | G11C 11/404 365/189.09 |
| 2015/0269990 A1 * | 9/2015 | Sahu ..................... | G11C 11/419 365/154 |
| 2015/0279446 A1 * | 10/2015 | Halbert ............... | G11C 11/4076 365/203 |

FOREIGN PATENT DOCUMENTS

JP          2010102790          5/2010

* cited by examiner

*Primary Examiner* — Ly D Pham
(74) *Attorney, Agent, or Firm* — Onello & Mello, LLP

(57) ABSTRACT

A precharge control signal generator and a semiconductor memory device include a precharge control signal generating circuit which generates a precharge control signal and applies the precharge control signal to a sensing circuit, and a sensing circuit configured to precharge a bit line connected to a memory cell according to the precharge control signal and read data stored in the memory cell. The precharge control signal controls the sensing circuit so that a precharge time is adjusted according to operating temperature.

16 Claims, 8 Drawing Sheets

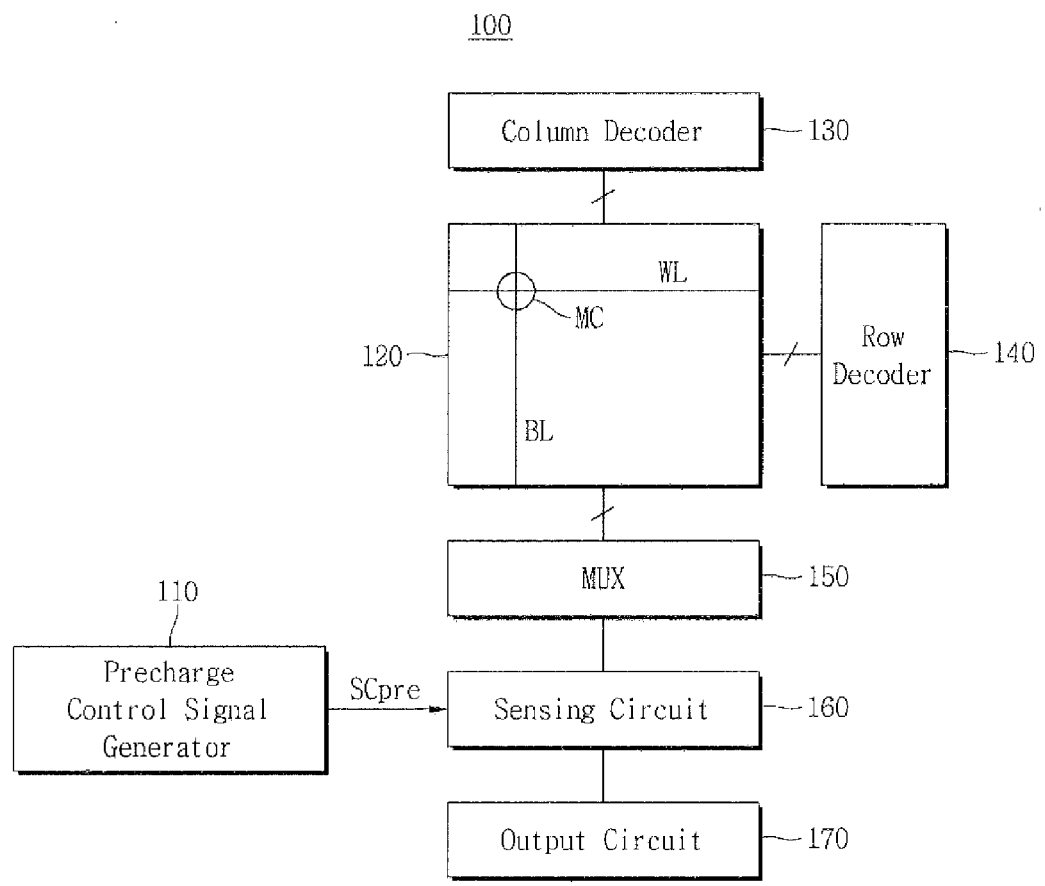
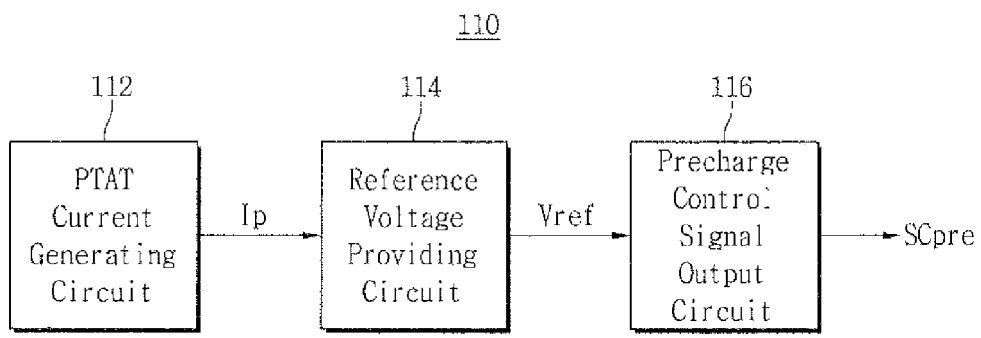

PRECHARGE CONTROL SIGNAL GENERATOR AND SEMICONDUCTOR MEMORY DEVICE THEREWITH

CROSS-REFERENCE TO RELATED APPLICATION

This application claims priority under 35 U.S.C. §119 to Korean Patent Application No 10-2014-0112588 filed on Aug. 27, 2014, the disclosure of which is hereby incorporated by reference in its entirety.

BACKGROUND

1. Field

Embodiments of the inventive concepts relate to a precharge control signal generator, and more particularly, to a precharge control signal generator included in a memory device.

2. Description of Related Art

In order to read data stored in a flash memory cell, a corresponding bit line is precharged to a predetermined voltage level through a precharge pulse, and then a determination is made as to whether the cell is turned on or off is detected by dropping the level of the bit line using a cell current. Here, an On cell corresponds to a data level of 1, and an Off cell corresponds to data level of 0. The tendency and variation of the precharge pulse according to the manner in which the pulse is applied can have a direct effect on read rate. In some cases, when a large amount of bit line leakage current is incurred, an Off cell failure can occur, in which case an Off cell may be misread as an On cell. When data are incorrectly determined, product reliability can be adversely affected.

Specifically, with the continuing trend toward further cell integration, the bit line leakage current of the Off cell can be relatively increased at high temperature operation, and thus, the Off cell failure rate can be increased.

In a conventional method, in order to mitigate or prevent the Off cell failure, the duration of the precharge signal has been controlled. When the precharge time was lengthened to meet desired Off cell detection characteristics, the lengthened precharge time can lead to over-precharging in certain On cells; also, lengthening the precharge time amounts to a decrease in read rate due to the amount of time needed for an unnecessary precharge. Further, since a bit line precharge characteristic can be degraded at a specific location by a difference in the cell characteristics due to variations in manufacturing processes, the read rate may become compromised in order to secure the precharge time for the degraded cell.

SUMMARY

Embodiments of the inventive concepts are directed to a circuit in which a precharge control signal, which may control a precharge time period with respect to a bit line connected to a corresponding memory cell, can be controlled according to operating temperature in order to accurately and quickly read data stored in a memory cell.

In accordance with an aspect of the inventive concepts, a semiconductor memory device includes a precharge control signal generating circuit which generates a precharge control signal and applies the precharge control signal to a sensing circuit, and the sensing circuit which precharges a bit line connected to the memory cell according to the precharge control signal and reads data stored in a memory cell. The precharge control signal may control the sensing circuit so that a precharge time is adjusted according to operating temperature.

In an embodiment, the precharge control signal may control the sensing circuit so that the precharge time is increased as the operating temperature is increased.

In another embodiment, the precharge control signal generating circuit may include a proportional to absolute temperature (PTAT) current generating circuit which generates a PTAT current, a reference voltage providing circuit which applies a reference voltage generated in response to the PTAT current to a precharge control signal output circuit, and the precharge control signal output circuit which outputs the precharge control signal in response to the reference voltage.

In still another embodiment, the reference voltage providing circuit may include a first node to which the PTAT current is applied, a MOS transistor connected between the first node and a power voltage and of which a gate terminal is connected to the first node, and a resistor connected between the first node and a ground voltage. The reference voltage may be a voltage between the first node and the ground voltage.

In yet another embodiment, the precharge control signal output circuit may include an amplification unit which receives the reference voltage and a comparison voltage and outputs the precharge control signal based on a difference between the reference voltage and the comparison voltage, and a comparison voltage adjusting unit which adjusts the comparison voltage according to the reference voltage.

In yet another embodiment, the comparison voltage adjusting unit may include a first device which is connected between a power voltage and a second node and adjusts current which flows into the second node according to the reference voltage, and a capacitor connected between the second node and a ground voltage. The comparison voltage may be a voltage level that varies between a maximum voltage of the second node and the ground voltage.

In yet another embodiment, the first device may comprise a PMOS transistor of which a gate terminal may receive the reference voltage.

In yet another embodiment, the precharge control signal generating circuit may include a PTAT voltage generating circuit which generates a PTAT voltage, and a precharge control signal output circuit which outputs the precharge control signal based on the PTAT voltage.

In yet another embodiment, the precharge control signal output circuit may include an amplification unit which receive the PTAT voltage and a comparison voltage and outputs the precharge control signal based on a difference between the PTAT voltage and the comparison voltage, and a comparison voltage adjusting unit which adjusts the comparison voltage according to the PTAT voltage.

In yet another embodiment, the comparison voltage adjusting unit may include a first device which is connected between a power voltage and a second node and adjusts a current which flows into the second node according to the PTAT voltage, and a capacitor connected between the second node and a ground voltage. The comparison voltage may be a voltage level that varies between a maximum voltage of the second node and the ground voltage.

In yet another embodiment, the first device may be a PMOS transistor of which a gate terminal may receive the PTAT voltage.

In accordance with another aspect of the inventive concepts, a precharge control signal generating circuit generates a precharge control signal for controlling a precharge time with respect to precharge performed in advance of reading data stored in a memory cell. The precharge control signal may adjust the precharge time according to operating temperature.

In an embodiment, the precharge control signal may control the precharge time to be increased as operating temperature is increased.

In another embodiment, the precharge control signal generating circuit may include a PTAT current generating circuit which generates a PTAT current, a reference voltage providing circuit which applies a reference voltage generated in response to the PTAT current to a precharge control signal output circuit, and the precharge control signal output circuit which outputs the precharge control signal in response to the reference voltage.

In still another embodiment, the reference voltage providing circuit may include a first node to which the PTAT current is applied, a MOS transistor connected between the first node and a power voltage and of which a gate terminal is connected to the first node, and a resistor connected between the first node and a ground voltage. The reference voltage may be a voltage between the first node and the ground voltage.

In yet another embodiment, the precharge control signal output circuit may include an amplification unit to which the reference voltage and a comparison voltage are applied and which outputs the precharge control signal based on a difference between the reference voltage and the comparison voltage, and a comparison voltage adjusting unit which adjusts the comparison voltage according to the reference voltage.

In yet another embodiment, the comparison voltage adjusting unit may include a first device which is connected between a power voltage and a second node and adjusts a current which flows into the second node according to the reference voltage, and a capacitor connected between the second node and a ground voltage. The comparison voltage may be a voltage between the second node and the ground voltage.

In accordance with still another aspect of the inventive concepts, a precharge control signal generating circuit includes a first voltage generating circuit which generates a first voltage, which is in proportion to a temperature, and applies the first voltage to a precharge control signal output circuit, and the precharge control signal output circuit which generates a precharge control signal based on the first voltage and outputs the precharge control signal. The precharge control signal may be in the form of a pulse signal in which duration at a specific level, which defines a precharge time according to the first voltage, is adjusted.

In an embodiment, the first voltage generating circuit may include a current generating circuit which generates a PTAT current, and a voltage providing circuit which applies the first voltage generated in response to the PTAT current to the precharge control signal output circuit. The voltage providing circuit may include a first node to which the PTAT current is applied, a MOS transistor connected between the first node and a power voltage and of which a gate terminal is connected to the first node, and a resistor connected between the first node and a ground voltage. The first voltage may be a voltage between the first node and the ground voltage.

In another embodiment, the precharge control signal output circuit may include an amplification unit which receives the first voltage and a comparison voltage and outputs the precharge control signal based on a difference between the first voltage and the comparison voltage, and a comparison voltage adjusting unit which adjusts the comparison voltage according to the first voltage. The comparison voltage adjusting unit may include a first device which is connected between a power voltage and a second node and adjusts a current which flows into the second node according to the first voltage, and a capacitor connected between the second node and a ground voltage. The comparison voltage may be a voltage between the second node and the ground voltage.

In accordance with another aspect of the inventive concepts, a precharge control signal generating circuit comprises: a proportional to absolute temperature (PTAT) signal generating circuit, the PTAT generating circuit including a current path in turn including a device having a resistance value that is inversely proportional to operating temperature, the PTAT signal generating circuit generating a PTAT signal in response to the resistance value; and a precharge control signal output circuit that generates a precharge control signal having a time duration that varies in response to the PTAT signal.

In some embodiments, the precharge control signal output circuit generates a precharge control signal to have a relatively increased time duration as the operating temperature is increased.

In some embodiments, the precharge control signal output circuit generates a precharge control signal to have a relatively decreased time duration as the operating temperature is decreased.

In some embodiments, the precharge control signal generating circuit is configured to receive the PTAT signal as a PTAT voltage level, to compare the PTAT voltage level to a comparison voltage and to output the precharge control signal as a result of the comparison.

In some embodiments, the PTAT signal comprises a current signal that is converted to a voltage signal.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 1 is a block diagram of a semiconductor memory device including a precharge control signal generator in accordance with an embodiment of the inventive concepts;

FIG. 2 is a block diagram of the precharge control signal generator in accordance with an embodiment of the inventive concepts;

DETAILED DESCRIPTION OF EMBODIMENTS

Figure 3:
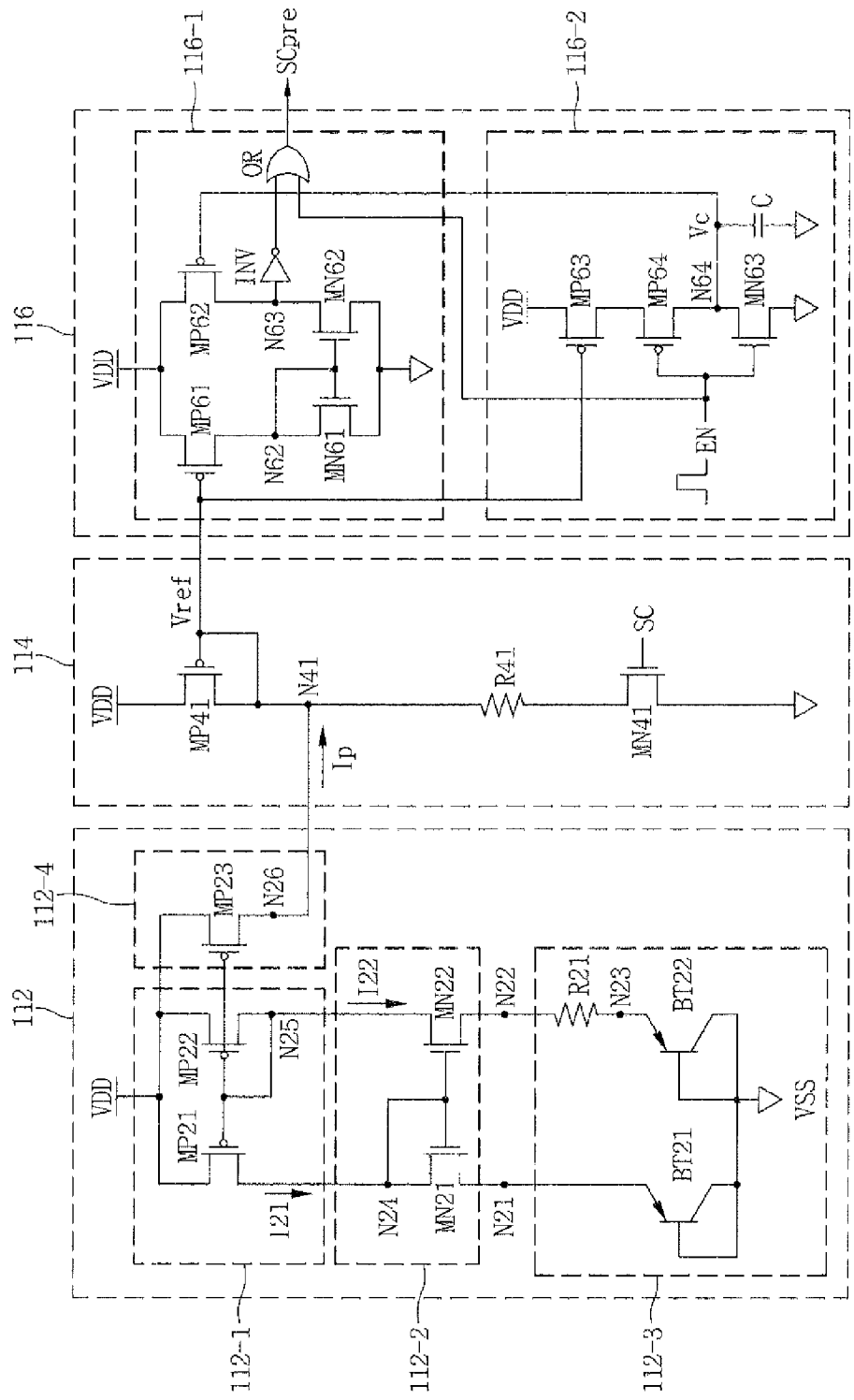
FIG. 3 is a circuit diagram showing an example of the precharge control signal generator shown in FIG. 2 in accordance with an embodiment of the inventive concepts.

Particular structural or functional descriptions for embodiments disclosed in this specification are only for the purpose of description of the embodiments of the inventive concepts. The embodiments of the inventive concepts may be various modifications in form and are not limited to the exemplary embodiments in this specification.

While the inventive concepts are susceptible to various modifications and alternative forms, specific embodiments thereof are shown by way of example in the drawings and will herein be described in detail. It should be understood, however, that there is no intent to limit the inventive concepts to the particular forms disclosed, but on the contrary, the inventive concepts are to cover all modifications, equivalents, and alternatives falling within the spirit and scope of the inventive concepts.

It will be understood that, although the terms "first," "second," etc. may be used herein to describe various elements, these elements should not be limited by these terms. These terms are only used to distinguish one element from another. For example, a first element could be termed a second element, and similarly, a second element could be termed a first element, without departing from the scope of the inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion, that is, "between" versus "directly between," adjacent" versus "directly adjacent," etc.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein are to be interpreted as is customary in the art to which this inventive concepts belong. It will be further understood that terms in common usage should also be interpreted as is customary in the relevant art and not in an idealized or overly formal sense unless expressly so defined herein.

Meanwhile, when an embodiment can be implemented differently, functions or operations described in a particular block may occur in a different way from a flow described in the flowchart. For example, two consecutive blocks may be performed simultaneously, or the blocks may be performed in reverse according to related functions or operations.

Hereinafter, exemplary embodiments of the inventive concepts will be described in detail with reference to the accompanying drawings.

FIG. 1 is a block diagram of a semiconductor memory device including a precharge control signal generator in accordance with an embodiment of the inventive concepts.

Referring to FIG. 1, the semiconductor memory device 100 may include a precharge control signal generator 110, a memory cell array 120, a column decoder 130, a row decoder 140, a multiplexer (MUX) 150, a sensing circuit 160, and an output circuit 170. In some embodiments, the semiconductor memory device 100 may comprise a flash memory device.

In some embodiments, the precharge control signal generator 110 generates a precharge control signal SCpre for which a bit line connected to a memory cell (MC) to be read is precharged when the data stored in the MC included in the memory cell array 120 is read. Here, the precharge control signal generator 110 generates the precharge control signal SCpre for which a time duration in which the bit line is adaptively precharged according to a temperature is adjusted, and provides the precharge control signal SCpre to the sensing circuit 160.

The memory cell array 120 includes a plurality of word lines WL, a plurality of bit lines BL, and a plurality of MCs connected to the word lines WL and the bit lines BL. The MCs each may comprise, for example, an NOR type memory cell or an SONOS type memory cell, and may, in some embodiments, store a data signal of one bit.

The memory cell array 120 applies a voltage corresponding to a read operation to the word line and the bit line which correspond to a selected memory cell of the plurality of memory cells during a read operation. In this case, by determining whether current flows into the selected memory cell or not, data stored in the selected memory cell may thus be read.

The column decoder 130 may apply a voltage according to the read operation to the bit line selected from the plurality of bit lines according to a column address signal.

The row decoder 140 may apply the voltage according to the read operation to the word line selected from the plurality of word lines according to a row address signal.

The multiplexer (MUX) 150 may connect the bit line selected from the plurality of bit lines to the sensing circuit 160 according to the column address signal.

The sensing circuit 160 may precharge the bit line connected through the MUX 150 according to the precharge control signal SCpre which is applied by the precharge control signal generator 110, and read specific data stored in the corresponding memory cell from the precharged bit line through a sense amplifier.

The sensing circuit 160 may employ a PMOS transistor as a precharger according to some embodiments. In some embodiments, a gate of the precharger may receive the precharge control signal SCpre, one end of a source/drain terminal of the precharger may receive a power voltage, and the other end of the source/drain terminal of the precharger may be connected to the corresponding bit line. Thus, the precharger may precharge the corresponding bit line during a low level duration of the precharge control signal.

The output circuit 170 may output a data signal detected by the sensing circuit 160 to an external circuit that is performing the read operation.

FIG. 2 is a block diagram of the precharge control signal generator in accordance with an embodiment of the inventive concepts.

Referring to FIG. 2, the precharge control signal generator 110 may include a proportional to absolute temperature (PTAT) current generating circuit 112, a reference voltage providing circuit 114, and a precharge control signal output circuit 116.

The PTAT current generating circuit 112 may generate a PTAT current Ip, which is in proportion to a temperature, in particular, an absolute temperature and inverse proportion to a resistance. The PTAT current Ip is, in turn, applied to the reference voltage providing circuit 114.

The reference voltage providing circuit 114 may generate a reference voltage Vref in response to the PTAT current Ip. The reference voltage Vref is, in turn, applied to the precharge control signal output circuit 116.

The precharge control signal output circuit 116 may generate a precharge control signal SCpre in response to the applied reference voltage Vref, to generate a precharge control signal SCpre. The precharge control signal SCpre, in turn, may be applied to the sensing circuit 160 (shown in FIG. 1).

FIG. 3 is a circuit diagram of an example of the precharge control signal generator shown in FIG. 2 in accordance with an embodiment of the inventive concepts.

Referring to FIG. 3, in some embodiments, a PTAT current generating circuit 112 may include a first current mirror unit 112-1, a second current mirror unit 112-2, a level control unit 112-3, and an output unit 112-4.

The first and second current mirror units 112-1 and 112-2 are connected between a power voltage VDD, a first node N21, and a second node N22. The units 112-1, 112-2 operate to mirror a first current I21 which flows through the first node N21 and a second current I22 which flows through the second node N22.

The first current mirror unit 112-1 may be connected between the power voltage VDD, a fourth node N24, and a fifth node N25, and may include a first pair of transistors MP21 and MP22 having a common gate. In some embodiments, the gates of the first pair of transistors MP21 and MP22 may be connected to the fifth node N25.

In some embodiments, the second current mirror unit 112-2 may be connected between the first node N21, the second node N22, the fourth node N24, and the fifth node N25, and may include a second pair of transistors MN21 and MN22 having a common gate. In some embodiments, the gates of the second pair of transistors MN21 and MN22 may be connected to the fourth node N24.

In some embodiments, the level control unit 112-3 may be connected between the first node N21, the second node N22, and a ground voltage VSS, and may be operable to control levels of the output currents I21 and I22 of the first and second current mirror units 112-1 and 112-2 based on voltage levels of the first node N21 and the second node N22.

In some embodiments, the level control unit 112-3 may include a first transistor BT21, a first resistor R21, and a second transistor BT22.

The first transistor BT21 may be connected in series between the first node N21 and the ground voltage VSS, and implemented as a bipolar junction transistor (BJT) in which an emitter is connected to the first node N21 and a base and a collector receive the ground voltage VSS.

The first resistor R21 forms a current path in series between the second node N22 and a third node N23. In some embodiments, the first resistor R21 may be a variable resistor having a resistance value which is in inverse proportion to the operating temperature thereof.

In some embodiments, the first resistor R21 may comprise a MOS transistor configured to operate as a resistor, for example, in which a gate terminal thereof receives a bias voltage, one end of a source/drain terminal thereof is connected to the second node N22, and the other end of the source/drain terminal is connected to the third node N23. Thus, the first resistor R21 may comprise a MOS transistor which may have a resistance value in inverse proportion to the temperature due to having a temperature coefficient in inverse proportion to the temperature. Therefore, the first resistor R21 may control a level of the second current I22 according to the temperature.

That is, according to an embodiment of the inventive concepts, since a resistance of the first resistor R21 is reduced as the operating temperature is increased, the second current I22 and the first current I21 in which the second current I22 is mirrored are correspondingly increased. Further, since an output current Ip is generated in inverse proportion to a resistance value of the first resistor R21, the PTAT current generating circuit 112 generates the output current Ip in proportion to the temperature and in inverse proportion to the first resistor R21, and thus, there is an effect in which output characteristics of the resulting device may be improved.

In some embodiments, the second transistor BT22 may be connected between the third node N23 and the ground voltage VSS, and implemented as a BJT in which an emitter is connected to the third node N23 and a base and a collector receive the ground voltage VSS.

In some embodiments, the output unit 112-4 may include a third transistor MP23. The output unit 112-4 may mirror the first current I21 or the second current I22, which is current mirrored by the first current mirror unit 112-1 or the second current mirror unit 112-2, and output the mirrored PTAT current Ip.

In some embodiments, a gate terminal of the third transistor MP23 may receive a voltage of the fifth node N25. The third transistor MP23 may form a current path between the power voltage VDD and a sixth node N26 and control a level of the PTAT current Ip.

The reference voltage providing circuit 114 may include a fourth transistor MP41, a second resistor R41, and a fifth transistor MN41.

In some embodiments, the fourth transistor MP41 may comprise a PMOS transistor of which a gate terminal is connected to a seventh node N41 to which the PTAT current Ip is applied, one end of a source/drain terminal thereof receives the power voltage VDD, and the other end of the source/drain terminal is connected to the seventh node N41.

One end of the second resistor R41 may be connected to the seventh node N41, and the other end of the second resistor R41 may be connected to one end of a source/drain terminal of the fifth transistor MN41.

In some embodiments, the fifth transistor MN41 may be an NMOS transistor in which a gate terminal thereof receives a control signal SC, one end of a source/drain terminal thereof is connected to the second resistor R41, and the other end of the source/drain terminal receives the ground voltage VSS. The fifth transistor MN41 may enable the reference voltage providing circuit 114 in response to the control signal SC.

When Kirchhoff's current law is applied to the seventh node N41, a relationship may be established according to the following Equation (1).

$$Ip + \{\beta(VDD - Vref + Vth)^2\}/2 - Vref/R41 = 0 \quad (1)$$

Further, the following Proportionality (2) may be established for the PTAT current Ip.

$$Ip \propto KT/R21 \quad (2)$$

Wherein, β is a characteristic constant of the fourth transistor MP41, Vth is a threshold voltage of the fourth transistor MP41, K is a proportionality constant, and T is a temperature.

According to the above Equation (1), when the temperature is increased, the PTAT current Ip is increased, and thus, the reference voltage Vref is also increased, and when the temperature is decreased, the PTAT current Ip is decreased, and thus, the reference voltage Vref is also decreased.

By the above Equation (1) and Proportionality (2), when the resistance of the first resistor R21 is increased, the PTAT current Ip is decreased, and thus, the reference voltage Vref is also decreased, and when the resistance of the first resistor R21 is decreased, the PTAT current Ip is increased, and thus, the reference voltage Vref is also increased. Therefore, an effect due to the second resistor R41 may be offset by the application of the inverse proportionality.

In some embodiments, the precharge control signal output circuit 116 may include an amplification unit 116-1 and a comparison voltage adjusting unit 116-2.

In some embodiments, the amplification unit 116-1 may output a precharge control signal SCpre based on a difference between the reference voltage Vref and a comparison voltage Vc, and the comparison voltage adjusting unit 116-2 may operate to adjust the comparison voltage Vc according to a change of the reference voltage Vref.

The amplification unit 116-1 may include a sixth transistor MP61, a seventh transistor MP62, an eighth transistor MN61, a ninth transistor MN62, an inverter INV, and an OR gate OR.

The sixth transistor MP61 may comprise a PMOS transistor in which one end of a source/drain terminal thereof receives the power voltage VDD, the other end of the source/drain terminal is connected to an eighth node N62, and a gate terminal thereof is connected to the seventh node N41. A gate terminal of the sixth transistor MP61 may receive the reference voltage Vref which is a voltage of the seventh node N41.

In some embodiments, the seventh transistor MP62 may comprise a PMOS transistor in which at one end, a source/drain terminal thereof receives the power voltage VDD, and in which at the other end, a source/drain terminal is connected to a ninth node N63, and a gate terminal thereof is connected to a tenth node N64. In some embodiments, a gate terminal of the seventh transistor MP62 may be connected to the comparison voltage Vc which is a voltage of a capacitor C.

In some embodiments, the eighth transistor MN61 may comprise an NMOS transistor in which one end of a source/drain terminal thereof receives the ground voltage VSS, the other end of the source/drain terminal of is connected to the eighth node N62, and a gate terminal thereof is connected to the eighth node N62.

The ninth transistor MN62 may comprise an NMOS transistor in which one end of a source/drain terminal thereof receives the ground voltage VSS, the other end of the source/drain terminal is connected to the ninth node N63, and a gate terminal thereof is connected to the eighth node N62.

An input terminal of the inverter INV may be connected to the ninth node N63, and the inverter INV may output an inverted signal of a signal thereof to the OR gate OR.

The OR gate OR may perform a logic OR operation with respect to an enable signal EN and an output signal of the inverter INV, and, in response to the logic operation, output the precharge control signal SCpre.

The comparison voltage adjusting unit 116-2 may include a tenth transistor MP63, an eleventh transistor MP64, a twelfth transistor MN63, and the capacitor C.

In some embodiments, the tenth transistor MP63 may comprise a PMOS transistor in which one end of a source/drain terminal thereof receives the power voltage VDD, and in which the other end of a source/drain terminal is connected to a source/drain terminal of an end of the eleventh transistor MP64, and a gate terminal thereof is connected to the seventh node N41. The tenth transistor MP63 may receive the reference voltage Vref which is the voltage of the seventh node N41.

The eleventh transistor MP64 may be a PMOS transistor in which one end of a source/drain terminal thereof is connected to the other end of the source/drain terminal of the tenth transistor MP63, the other end of the source/drain terminal is connected to the tenth node N64, and a gate terminal thereof receives the enable signal EN.

The twelfth transistor MN63 may be an NMOS transistor in which one end of a source/drain terminal thereof is connected to the tenth node N64, the other end of the source/drain terminal receives the ground voltage VSS, and a gate terminal thereof receives the enable signal EN.

One end of the capacitor C may be connected to the tenth node N64, and the other end thereof may receive the ground voltage VSS.

Figure 4:
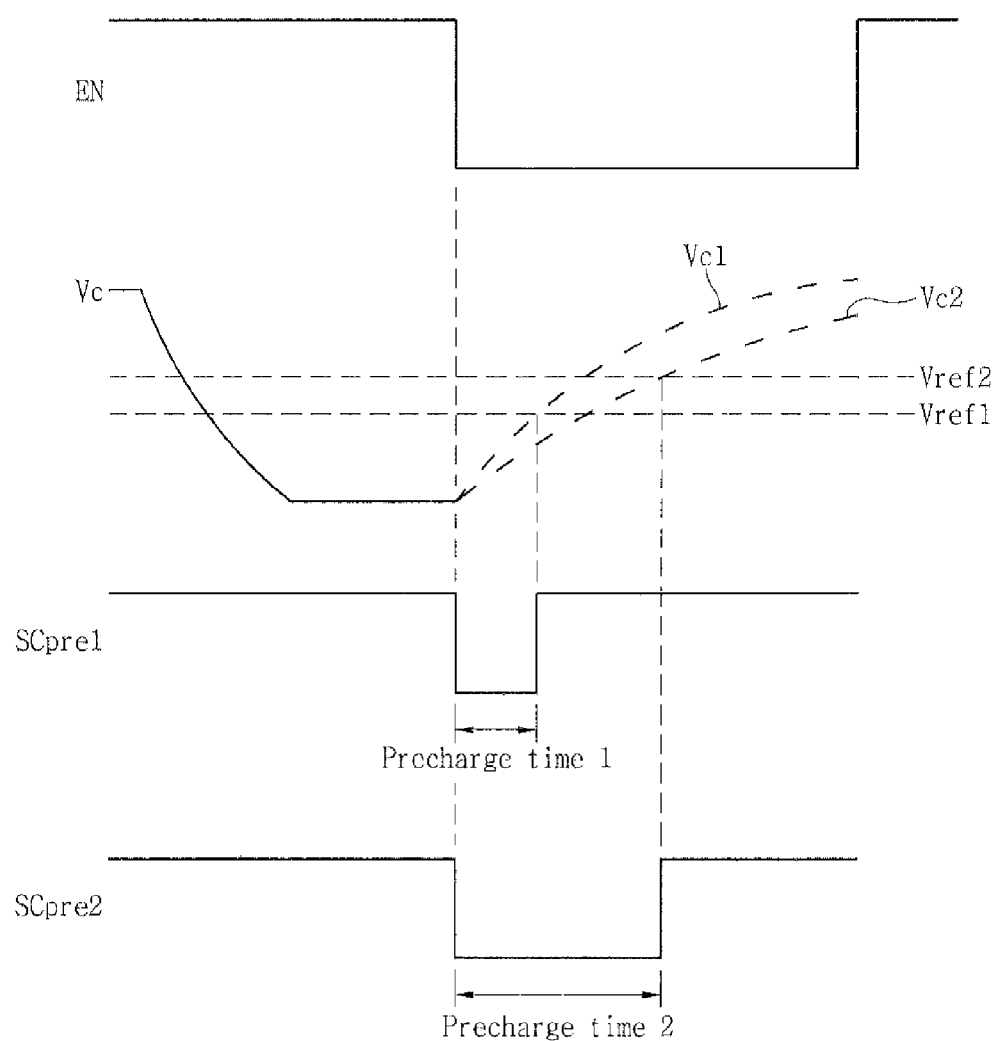
FIG. 4 is a signal time graph for describing an operation of the precharge signal output circuit in accordance with an embodiment of the inventive concepts.

FIG. 4 is a signal time graph for describing an operation of the precharge control signal output circuit 110 in accordance with an embodiment of the inventive concepts.

Referring to FIGS. 3 and 4, according to an embodiment of the inventive concepts, a reference voltage Vref is increased as a temperature is increased. In the embodiment, a reference voltage Vref2 and a comparison voltage Vc2 represent voltage levels that are present when an operating temperature is T2, and a reference voltage Vref1 and a comparison voltage Vc1 represent voltage levels that are present when an operating temperature is T1. In this case, the temperature T2 is greater than the temperature T1.

When the enable signal EN is at a high level, the eleventh transistor MP64 is turned off, the twelfth transistor MN63 is turned on, and then the capacitor C is discharged.

When the enable signal EN is at a low level, the eleventh transistor MP64 is turned on, the twelfth transistor MN63 is turned off, and then the capacitor C is charged. In this case, since the tenth transistor MP63, as a PMOS transistor, of the comparison voltage adjusting unit 116-2 causes a lesser amount of charge current to flow through the tenth transistor MP63 as the temperature is high and the reference voltage Vref is increased, the tenth transistor MP63 controls a charging rate of the capacitor C to be relatively slower.

Therefore, during a low level duration (precharge time 1) of a precharge control signal SCpre1 in a pulse shape, which is output when the operating temperature is relatively low, a precharger of the sensing circuit is enabled and precharges the corresponding bit line.

Further, during a low level duration (precharge time 2) of a precharge control signal SCpre2 of a pulse shape, which is output when the operating temperature is relatively high, the precharger of the sensing circuit is enabled and precharges the corresponding bit line.

Therefore, the precharge time is relatively increased as the operating temperature is increased, and the precharge time is relatively reduced as the temperature is decreased.

Thus, when the operating temperature is high, a sensing error that may otherwise be caused due to a bit line leakage current may be relatively mitigated or eliminated by increasing the precharge time.

Further, when the operating temperature is relatively low, the read rate of the unit may be relatively increased by decreasing the precharge time.

Since an adverse effect, that would otherwise be present due to variable resistance, may be offset, the problem of an increased deviation of the precharge time according to the variable resistance may be mitigated or eliminated. Thus, any unnecessary precharge time as a result of the variable resistance may also be reduced or otherwise optimized.

Figure 5:
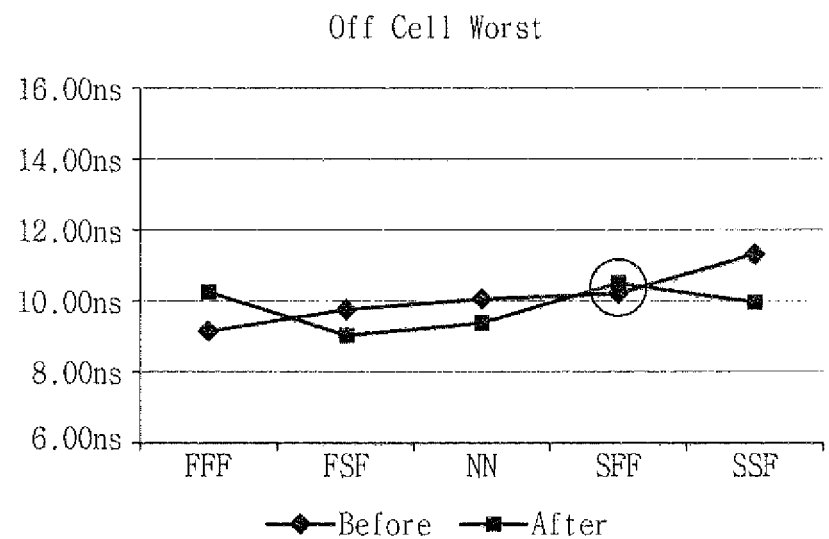
FIGS. 5 and 6 are simulation graphs for describing a change of a precharge time in accordance with an embodiment of the inventive concepts.
Figure 6:
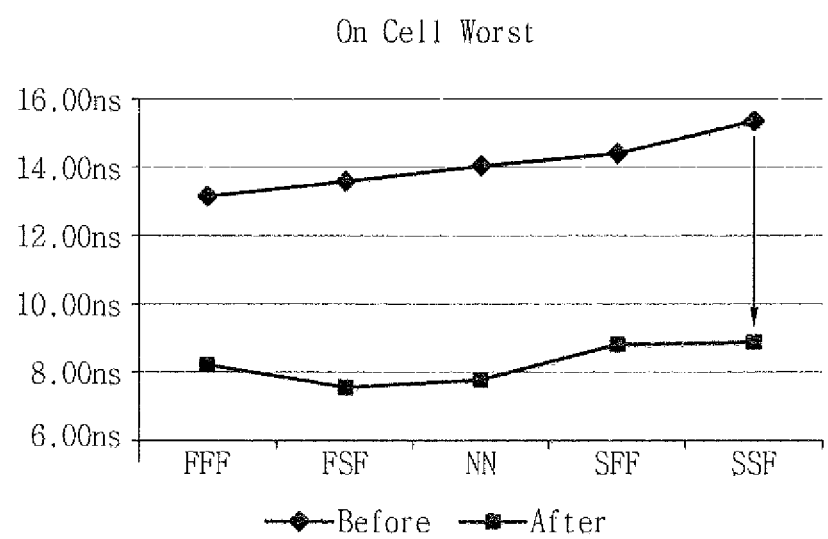

FIGS. 5 and 6 are simulation graphs for describing the effect of a change in precharge time in accordance with an embodiment of the inventive concepts.

As a result of the simulation in the case of FIG. 5, a precharge time as much as an existing precharge time which does not cause a sensing error may be obtained at a point SFF which represents a worst case of an Off cell of which a temperature is relatively high.

As a result of the simulation in the case of FIG. 6, the precharge time which is more reduced than the existing precharge time may be obtained at a point SSF, which represents a worst case of an On cell in which a temperature is relatively low, without causing a sensing error.

Figure 7:
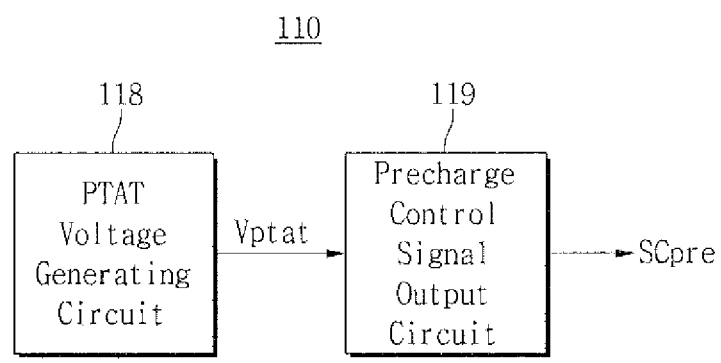
FIG. 7 is a block diagram of a precharge control signal generator in accordance with another embodiment of the inventive concepts.

FIG. 7 is a block diagram of a precharge control signal generator in accordance with another embodiment of the inventive concepts.

Referring to FIG. 7, in some embodiments, the precharge control signal generator 110 may include a PTAT voltage generating circuit 118 and a precharge control signal output circuit 119.

In the present embodiment, the PTAT voltage generating circuit 118 may generate a PTAT voltage Vptat in proportion to an operating temperature, and specifically, in proportion to and operating absolute temperature. The thus-generated PTAT voltage Vptat is applied to the precharge control signal output circuit 119.

The precharge control signal output circuit 119 may generate a precharge control signal SCpre in response to the applied PTAT voltage Vptat. The generated precharge control signal SCpre is then applied to the sensing circuit 160 (shown in FIG. 1).

Figure 8:
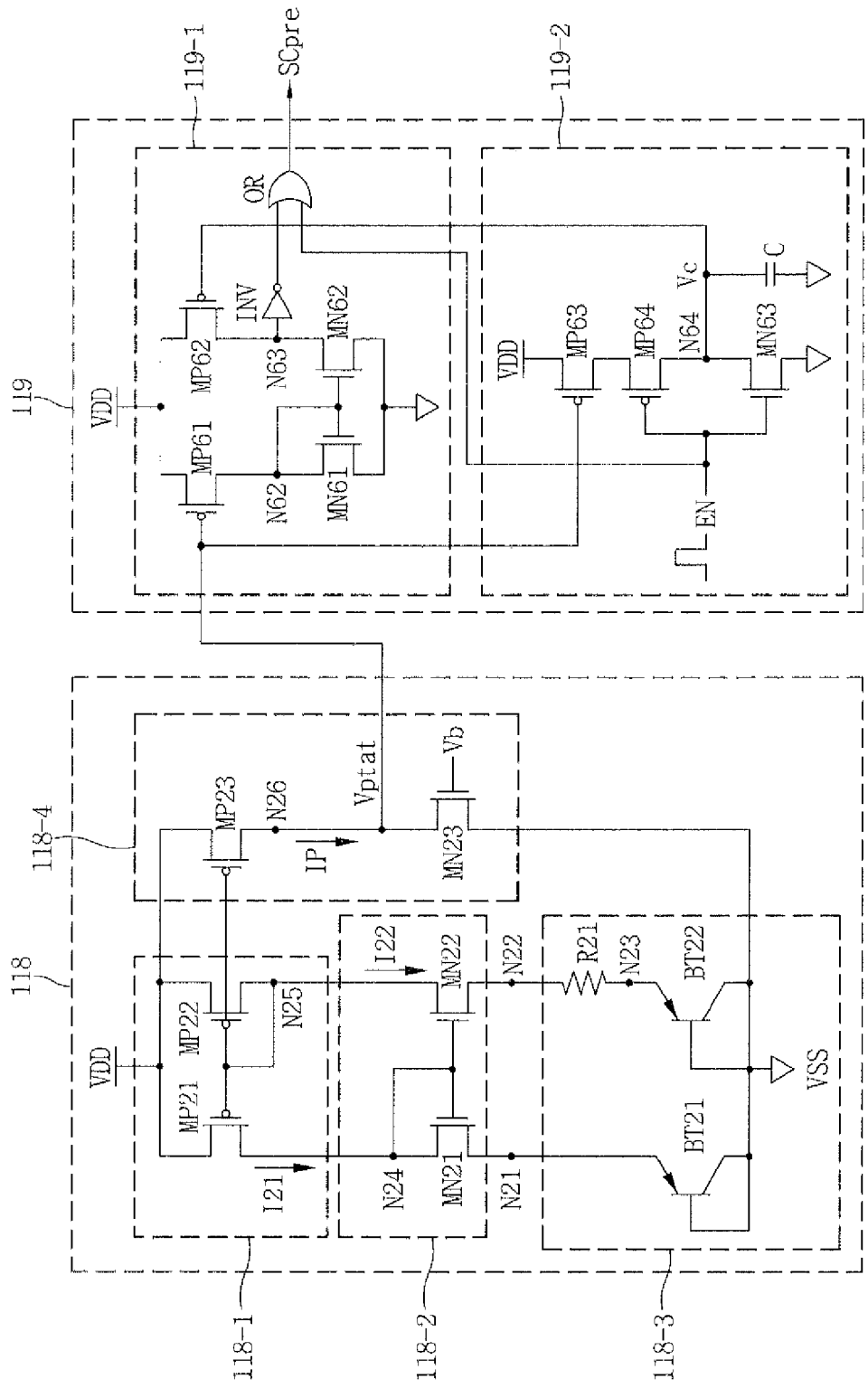
FIG. 8 is a circuit diagram showing an example of the precharge control signal generator shown in FIG. 7 in accordance with the embodiment of the inventive concepts.

FIG. 8 is a circuit diagram of an example of the precharge control signal generator shown in FIG. 7 in accordance with an embodiment of the inventive concepts.

Referring to FIG. 8, the PTAT voltage generating circuit 118 may include a first current mirror unit 118-1, a second current mirror unit 118-2, a level control unit 118-3, and an output unit 118-4.

Since the first current mirror unit 118-1, the second current mirror unit 118-2, and the level control unit 118-3 are similar to, or the same as, the first current mirror unit 112-1, the second current mirror unit 112-2, and the level control unit 112-3 shown in FIG. 3, descriptions thereof will be omitted.

In some embodiments, the output unit 118-4 may include a third transistor MP23 and a thirteenth transistor MN23.

In some embodiments, the output unit 118-4 may operate to mirror a first current I21 or a second current I22 which is a current mirrored by the first current mirror unit 118-1 or the second current mirror unit 118-2, and convert a mirrored PTAT current Ip to output a PTAT voltage Vptat which is a PTAT voltage.

In this embodiment, a gate terminal of the third transistor MP23 may receive a voltage of the fifth node N25. Further, the third transistor MP23 may form a current path among a power voltage VDD and a sixth node N26, and control a level of the PTAT current Ip.

A gate terminal of the thirteenth transistor MN23 may receive a bias voltage Vb. And then, the thirteenth transistor MN23 may form a current path between the sixth node N26 and a ground voltage VSS. The thirteenth transistor MN23 may convert the PTAT current Ip into a PTAT voltage, and control a level of the PTAT voltage Vptat.

In some embodiments, the precharge control signal output circuit 119 may include an amplification unit 119-1 and a comparison voltage adjusting unit 119-2.

The amplification unit 119-1 may output a precharge control signal SCpre based on a difference between the PTAT voltage Vptat and a comparison voltage Vc, and the comparison voltage adjusting unit 119-2 may adjust the comparison voltage Vc according to a change of the PTAT voltage Vptat.

Since the precharge control signal output circuit 119 is similar to, or the same as, the precharge control signal output circuit 116 shown in FIG. 3 except that the reference voltage Vref is replaced by the PTAT voltage Vptat, more detailed descriptions thereof will be omitted.

Since it may be understood that an operation of the precharge control signal output circuit is replaced by the operation of the precharge control signal output circuit shown in FIG. 4 except that the reference voltage Vref1 is replaced by a PTAT voltage Vptat1 and the reference voltage Vref2 is replaced by a PTAT voltage Vptat2, more detailed descriptions thereof will also be omitted.

Figure 9:
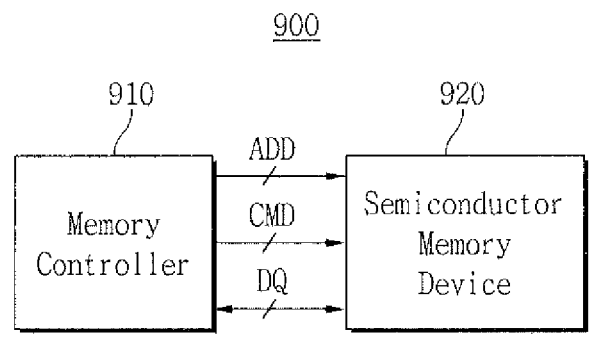
FIG. 9 is a block diagram showing an example of a semiconductor memory system including the semiconductor memory device in accordance with embodiments of the inventive concepts.

FIG. 9 is a block diagram showing an example of a semiconductor memory system including the semiconductor memory device in accordance with embodiments of the inventive concepts.

Referring to FIG. 9, the memory system 900 may include a memory controller 910 and a semiconductor memory device 920.

The memory controller 910 may generate an address signal ADD and a command signal CMD, and provide the address signal ADD and the command signal CMD to the semiconductor memory device 920, for example, via a bus. Data DQ may be transmitted from the memory controller 910 to the semiconductor memory device 920 through the bus, or from the semiconductor memory device 920 to the memory controller 910 through the bus.

In some embodiments, the semiconductor memory device 920 may include the semiconductor memory device 100 shown in FIG. 1, and the precharge control signal generator shown in FIG. 3 or FIG. 8.

Figure 10:
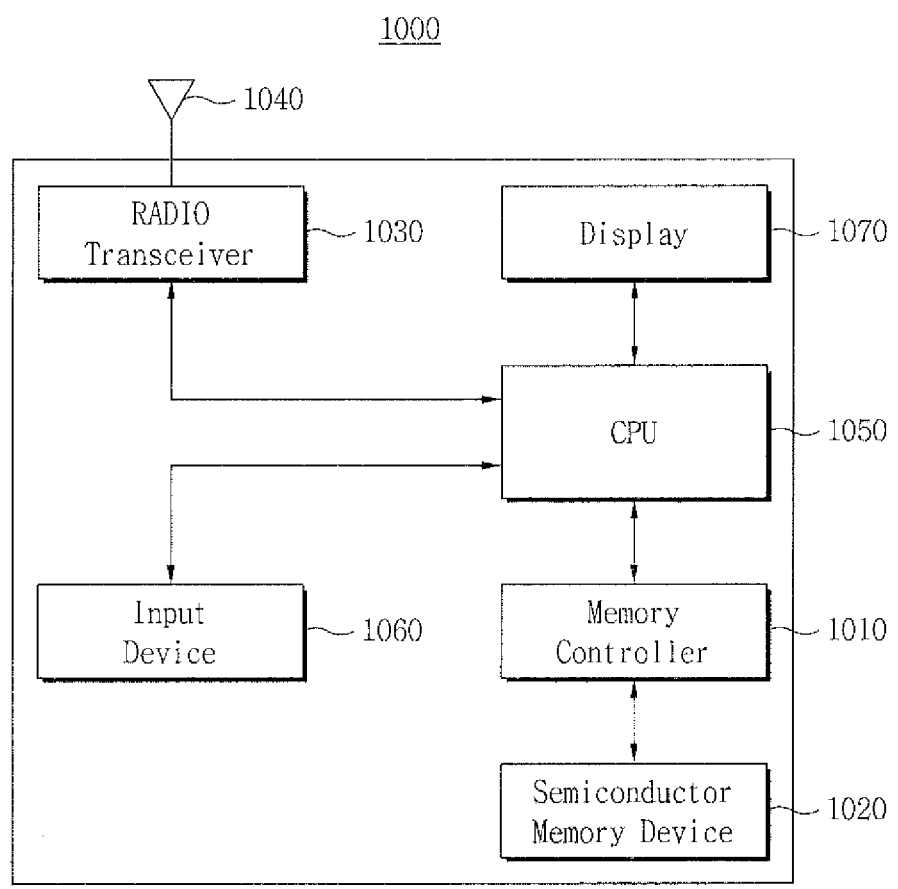
FIG. 10 is a block diagram showing an example of a computer system including the semiconductor memory device in accordance with embodiments of the inventive concepts.

FIG. 10 is a block diagram showing an example of a computer system including the semiconductor memory device in accordance with embodiments of the inventive concepts.

Referring to FIG. 10, the computer system 1000 may include a semiconductor memory device 1020, a memory controller 1010 which controls the semiconductor memory device 1020, a radio transceiver 1030, an antenna 1040, a central processing unit (CPU) 1050, an input device 1060, and a display 1070.

The radio transceiver 1030 may transmit or receive radio signals through the antenna 1040. For example, the radio transceiver 1030 may convert a radio signal received through the antenna 1040 into a signal which may be processed in the CPU 1050.

The CPU 1050 may process a signal output from the radio transceiver 1030, and transmit a processed signal to the display 1070. Further, the radio transceiver 1030 may convert a signal output from the CPU 1050 into a radio signal, and transmit the converted radio signal to an external device through the antenna 1040.

As the input device 1060 is a device in which a control signal for controlling an operation of the CPU 1050, or data to be processed by the CPU 1050 may be input, the input device 1060 may be implemented as a pointing device, such as a touch pad or a computer mouse, a keypad, or a keyboard.

The memory controller 1010 may transmit data received from the CPU 1050 to the semiconductor memory device 1020 or may transmit data received from the semiconductor memory device 1020 to the CPU 1050.

The semiconductor memory device 1020 may store data received from the memory controller 1010 into a memory cell, and transmit data read from the memory cell to the memory controller 1010, The semiconductor memory device 1020 may include the semiconductor memory device 100 shown in FIG. 1, and the precharge control signal generator shown in FIG. 3 or FIG. 8 in addition.

Figure 11:
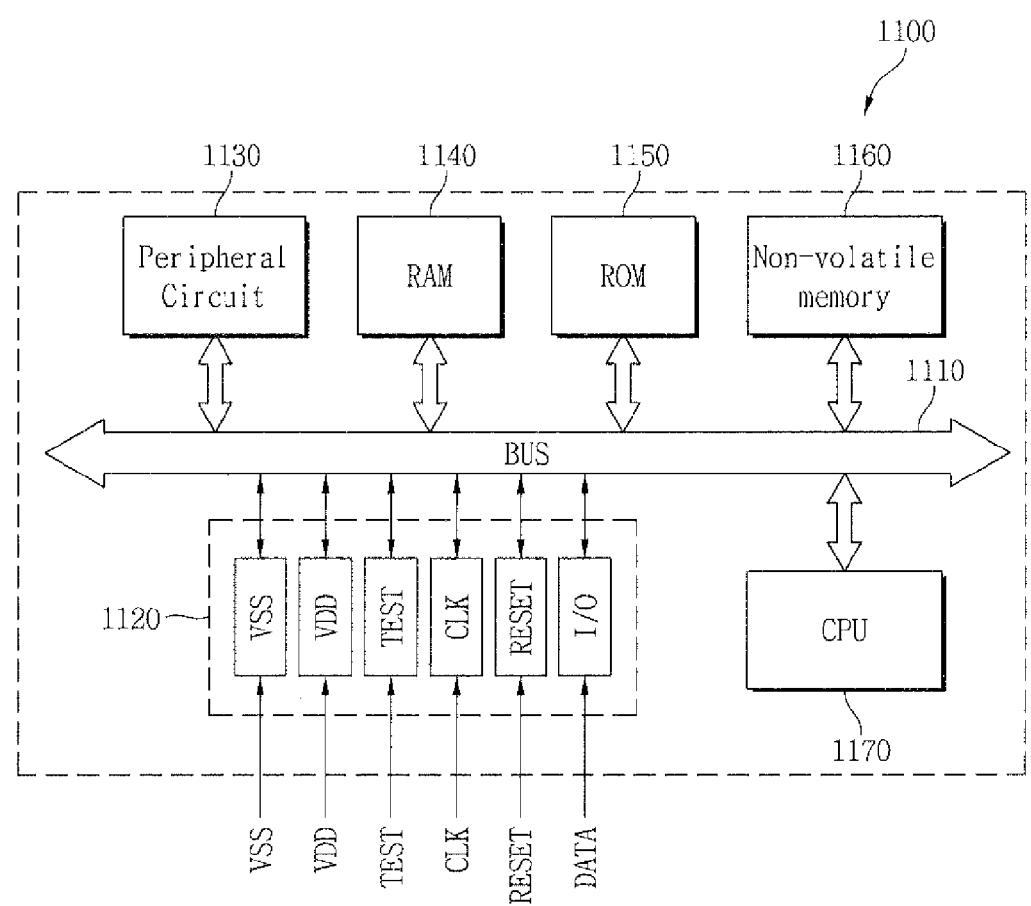
FIG. 11 is a block diagram showing an example of a smart card including the semiconductor memory device in accordance with embodiments of the inventive concepts.

FIG. 11 is a block diagram showing an example of a smart card including the semiconductor memory device in accordance with embodiments of the inventive concepts.

Referring to FIG. 11, the smart card 1100 may include a bus 1110, a plurality of pads 1120, a peripheral circuit 1130, a RAM 1140, a ROM 1150, a non-volatile memory (NVM) 1160, and a CPU 1170.

Various types of data and control signals may be transmitted to each component of the smart card 1100 through the bus 1110.

A ground voltage VSS, a power voltage VDD, a reset signal RESET, a clock signal CLK, a test signal TEST, and a data signal DATA may be received through the plurality of pads 1120.

The peripheral circuit 1130 may include circuits which perform various functions of the smart card 1100 except the CPU 1170.

Various types of data may be stored in the RAM 1140, the ROM 1150, and the NVM 1160. The NVM 1160 may include the semiconductor memory device 100 shown in FIG. 1, and the precharge control signal generator shown in FIG. 3 or FIG. 8 in addition.

The CPU 1170 may process various applications to perform functions of the smart card 1100.

According to embodiments of the inventive concepts, a precharge time can be adaptively controlled in response to operating temperature. As a result, there is an effect in which data stored in a memory cell can be quickly and accurately read while mitigating or eliminating error.

In addition, according to embodiments of the inventive concepts, since an effect due to variable resistance, for example resistance that varies in response to operating temperature can be offset, a problem in that a deviation of the precharge time is relatively increased in accordance with increased resistance can be resolved.

Embodiments of the inventive concepts can be applicable to a semiconductor memory device, and additionally, can be used for various devices including the semiconductor memory device in accordance with embodiments of the inventive concepts.

Although a few embodiments have been described, those skilled in the art will readily appreciate that many modifications are possible in embodiments without materially departing from the novel teachings and advantages.

What is claimed is:

1. A semiconductor memory device, comprising:
   a precharge control signal generating circuit configured to generate a precharge control signal and to apply the precharge control signal to a sensing circuit; and
   the sensing circuit configured to precharge a bit line connected to a memory cell according to the precharge control signal and read data stored in the memory cell,
   wherein the precharge control signal controls the sensing circuit so that a precharge time is adjusted according to operating temperature, and
   wherein the precharge control signal generating circuit comprises a proportional to absolute temperature (PTAT) current generating circuit configured to generate a PTAT current used to generate the precharge control signal.

2. The device of claim 1, wherein the precharge control signal controls the sensing circuit so that the precharge time is increased as the operating temperature is increased.

3. The device of claim 1, wherein the precharge control signal generating circuit further comprises:
   a reference voltage providing circuit configured to apply a reference voltage generated in response to the PTAT current to a precharge control signal output circuit; and
   the precharge control signal output circuit configured to output the precharge control signal in response to the reference voltage.

4. The device of claim 3, wherein the reference voltage providing circuit comprises:
   a first node to which the PTAT current is applied;
   a MOS transistor connected between the first node and a power voltage, wherein a gate terminal of the MOS transistor is connected to the first node; and
   a resistor connected between the first node and a ground voltage,
   wherein the reference voltage is a voltage level that varies between a maximum voltage level of the first node and the ground voltage.

5. The device of claim 3, wherein the precharge control signal output circuit comprises:
   an amplification unit configured to receive the reference voltage and a comparison voltage and output the precharge control signal based on a difference between the reference voltage and the comparison voltage; and
   a comparison voltage adjusting unit configured to adjust the comparison voltage according to the reference voltage.

6. The device of claim 5, wherein the comparison voltage adjusting unit comprises:
   a first device connected between a power voltage and a second node and configured to adjust current which flows into the second node according to the reference voltage; and
   a capacitor connected between the second node and a ground voltage,
   wherein the comparison voltage is a voltage level that varies between a maximum voltage level of the second node and the ground voltage.

7. The device of claim 6, wherein the first device comprises a PMOS transistor of which a gate terminal receives the reference voltage.

8. A semiconductor memory device, comprising:
a precharge control signal generating circuit configured to generate a precharge control signal and to apply the precharge control signal to a sensing circuit; and
the sensing circuit configured to precharge a bit line connected to a memory cell according to the precharge control signal and read data stored in the memory cell,
wherein the precharge control signal controls the sensing circuit so that a precharge time is adjusted according to operating temperature, and
wherein the precharge control signal generating circuit comprises:
a PTAT voltage generating circuit configured to generate a PTAT voltage used to generate the precharge control signal.

9. The device of claim 8, wherein the precharge control signal generating circuit further comprises:
a precharge control signal output circuit configured to output the precharge control signal based on the PTAT voltage.

10. The device of claim 9, wherein the precharge control signal output circuit comprises:
an amplification unit configured to receive the PTAT voltage and a comparison voltage and output the precharge control signal based on a difference between the PTAT voltage and the comparison voltage; and
a comparison voltage adjusting unit configured to adjust the comparison voltage according to the PTAT voltage.

11. The device of claim 10, wherein the comparison voltage adjusting unit comprises:
a first device connected between a power voltage and a second node and configured to adjust current which flows into the second node according to the PTAT voltage; and
a capacitor connected between the second node and a ground voltage,
wherein the comparison voltage is a voltage level that varies between a maximum voltage level of the second node and the ground voltage.

12. A precharge control signal generating circuit which generates a precharge control signal for controlling a precharge time with respect to precharge operation performed in advance of a read operation of data stored in a memory cell, wherein the precharge control signal adjusts the precharge time according to operating temperature, and wherein the precharge control signal generating circuit comprises a PTAT current generating circuit configured to generate a PTAT current used to generate the precharge control signal.

13. The circuit of claim 12, wherein the precharge control signal generating circuit comprises:
a reference voltage providing circuit configured to apply a reference voltage generated in response to the PTAT current to a precharge control signal output circuit; and
the precharge control signal output circuit configured to output the precharge control signal in response to the reference voltage.

14. The circuit of claim 13, wherein the reference voltage providing circuit comprises:
a first node to which the PTAT current is applied;
a MOS transistor connected between the first node and a power voltage, wherein a gate terminal of the MOS transistor is connected to the first node; and
a resistor connected between the first node and a ground voltage,
wherein the reference voltage is a voltage between the first node and the ground voltage.

15. The circuit of claim 13, wherein the precharge control signal output circuit comprises:
an amplification unit configured to receive the reference voltage and a comparison voltage and output the precharge control signal based on a difference between the reference voltage and the comparison voltage; and
a comparison voltage adjusting unit configured to adjust the comparison voltage according to the reference voltage.

16. The circuit of claim 15, wherein the comparison voltage adjusting unit comprises:
a first device connected between a power voltage and a second node and configured to adjust current which flows into the second node according to the reference voltage; and
a capacitor connected between the second node and a ground voltage,
wherein the comparison voltage is a voltage level that varies between a maximum voltage of the second node and the ground voltage.

* * * * *